United States Patent
Kuo

(10) Patent No.: US 10,573,683 B2
(45) Date of Patent: Feb. 25, 2020

(54) LIGHT-EMITTING DIODE CHIP

(71) Applicant: Lextar Electronics Corporation, Hsinchu (TW)

(72) Inventor: Shiou-Yi Kuo, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/046,990

(22) Filed: Jul. 26, 2018

(65) Prior Publication Data

US 2018/0337213 A1 Nov. 22, 2018

Related U.S. Application Data

(62) Division of application No. 15/792,743, filed on Oct. 24, 2017, now Pat. No. 10,062,729.

(30) Foreign Application Priority Data

Oct. 28, 2016 (TW) .............................. 105135082 A

(51) Int. Cl.
*H01L 27/15* (2006.01)
*H01L 23/62* (2006.01)
(Continued)

(52) U.S. Cl.
CPC .............. *H01L 27/15* (2013.01); *H01L 23/62* (2013.01); *H01L 25/167* (2013.01); *H01L 33/06* (2013.01);
(Continued)

(58) Field of Classification Search
CPC ...................... H01L 27/15–156; H01L 33/382
See application file for complete search history.

(56) References Cited

U.S. PATENT DOCUMENTS

2002/0139987 A1* 10/2002 Collins, III ........... H01L 27/153
257/88
2005/0167680 A1 8/2005 Shei et al.
(Continued)

FOREIGN PATENT DOCUMENTS

CN 102201427 A 9/2011
CN 105531834 A 4/2016
(Continued)

*Primary Examiner* — Robert G Bachner
*Assistant Examiner* — Molly K Reida
(74) *Attorney, Agent, or Firm* — CKC & Partners Co., LLC

(57) ABSTRACT

A light-emitting diode (LED) chip includes a substrate, a conductive layer, a first insulator layer, a light-emitting component, and an ESD protection component. The conductive layer is disposed on the substrate. The first insulator layer is disposed on the conductive layer and has a first opening and a second opening. The light-emitting component is disposed on the first insulator layer and includes a first semiconductor layer, a first quantum well layer, and a second semiconductor layer. The ESD protection component is disposed on the first insulator layer and separated from the light-emitting component. The ESD protection component includes a third semiconductor layer, a second quantum well layer, and a fourth semiconductor layer. The second quantum well layer is disposed between the third and fourth semiconductor layers. The first and fourth semiconductor layers are electrically isolated from each other before packaging the LED chip.

9 Claims, 4 Drawing Sheets

(51) Int. Cl.
*H01L 33/06* (2010.01)
*H01L 33/38* (2010.01)
*H01L 25/16* (2006.01)
*H01L 33/60* (2010.01)

(52) U.S. Cl.
CPC .......... *H01L 33/382* (2013.01); *H01L 33/385* (2013.01); *H01L 33/60* (2013.01)

(56) References Cited

U.S. PATENT DOCUMENTS

| | | |
|---|---|---|
| 2006/0163604 A1 | 7/2006 | Shin et al. |
| 2013/0207156 A1* | 8/2013 | Moosburger ............ H01L 27/15 257/99 |
| 2014/0231832 A1 | 8/2014 | Lee |
| 2014/0231852 A1 | 8/2014 | Suh et al. |
| 2015/0091041 A1 | 4/2015 | Yoon et al. |
| 2016/0218096 A1 | 7/2016 | Lee et al. |

FOREIGN PATENT DOCUMENTS

| | | |
|---|---|---|
| CN | 105990390 A | 10/2016 |
| KR | 20010088929 A | 9/2001 |
| TW | 492202 B | 6/2002 |
| TW | I229463 B | 3/2005 |
| TW | 201145566 A1 | 12/2011 |
| TW | 201208117 A1 | 2/2012 |
| TW | I414082 B | 11/2013 |
| TW | 201532309 A | 8/2015 |

\* cited by examiner

LIGHT-EMITTING DIODE CHIP

RELATED APPLICATIONS

This present application is a divisional of U.S. application Ser. No. 15/792,743, filed Oct. 24, 2017, which claims priority to Taiwan Application Serial Number 105135082, filed Oct. 28, 2016. The entire disclosure of the above application is hereby incorporated by reference herein.

BACKGROUND

Technical Field

The present disclosure relates to a light-emitting-diode chip.

Description of Related Art

In the recent years, light-emitting diodes (LEDs) have been widely used in common and commercial lighting applications. When being used as light sources, the LEDs have many advantages including low power consumption, long service life, small size, and fast switching speed Hence, conventional illumination sources, such as an incandescent light source have been gradually replaced by LED light sources. Furthermore, in actual applications, the LEDs are designed together with an electrical-modulation component in the same circuit, so as to prevent the LED from being damaged. For example, the electrical-modulation component may provide the LEDs with a voltage-modulating function.

SUMMARY

An aspect of the present disclosure is to provide a light-emitting-diode (LED) chip including a light-emitting component and an electrical static discharge (ESD) protection component, in which the light-emitting component and the ESD protection component can be formed at the same time, thereby simplifying the process for manufacturing the LED chip. Before a packaging process with the LED chip is performed, since the light-emitting component together with the ESD protection component have not been formed in a circuit yet, the light-emitting component can be tested individually, thereby preventing the test result from being affected by the ESD protection component. After the packaging process with the LED chip is performed, the light-emitting component together with the ESD protection component may form a reverse parallel circuit, such that the ESD protection component can provide ESD protection on the LED chip.

An aspect of the present disclosure is to provide a LED chip including a substrate, a conductive layer, a first insulator layer, a light-emitting component, and an ESD protection component. The conductive layer is disposed on the substrate. The first insulator layer is disposed on the conductive layer and has a first opening and a second opening. The light-emitting component is disposed on the first insulator layer and includes a first semiconductor layer, a first quantum well layer, and a second semiconductor layer. The first semiconductor layer is disposed between the first insulator layer and the second semiconductor layer, and the first quantum well layer is disposed between the first and second semiconductor layers. The conductive layer passes through the first semiconductor layer and the first quantum well layer via the first opening of the first insulator layer, so as to be extended and electrically connected to the second semiconductor layer. The first semiconductor layer is isolated from the conductive layer by the first insulator layer. The ESD protection component is disposed on the first insulator layer and separated from the light-emitting component. The ESD protection component includes a third semiconductor layer, a second quantum well layer, and a fourth semiconductor layer. The third semiconductor layer is disposed between the conductive layer and the fourth semiconductor layer, and the second quantum well layer is disposed between the third and fourth semiconductor layers. The conductive layer is electrically connected to the third semiconductor layer through the second opening of the first insulator layer. Each of the first semiconductor layer and the third semiconductor layer has a first type dopant, each of the second semiconductor layer and the fourth semiconductor layer has a second type dopant. The first and fourth semiconductor layers are electrically isolated from each other before packaging the LED chip.

In some embodiments, the LED chip of claim 1 further includes an electrical-connection layer, a first electrical-connection pad, and a second electrical-connection pad. The electrical-connection layer is disposed on the first insulator layer and electrically connected to the first semiconductor layer. The first electrical-connection pad is disposed on the electrical-connection layer and electrically connected to the first semiconductor layer through the electrical-connection layer. The second electrical-connection pad is disposed on the fourth semiconductor layer and electrically connected to the fourth semiconductor layer.

In some embodiments, the first semiconductor layer and the third semiconductor layer are formed from the same material, and the second semiconductor layer and the fourth semiconductor layer are formed from the same material.

In some embodiments, a vertical projection of the light-emitting component on the substrate is rectangular.

DETAILED DESCRIPTION

Figure 1B:
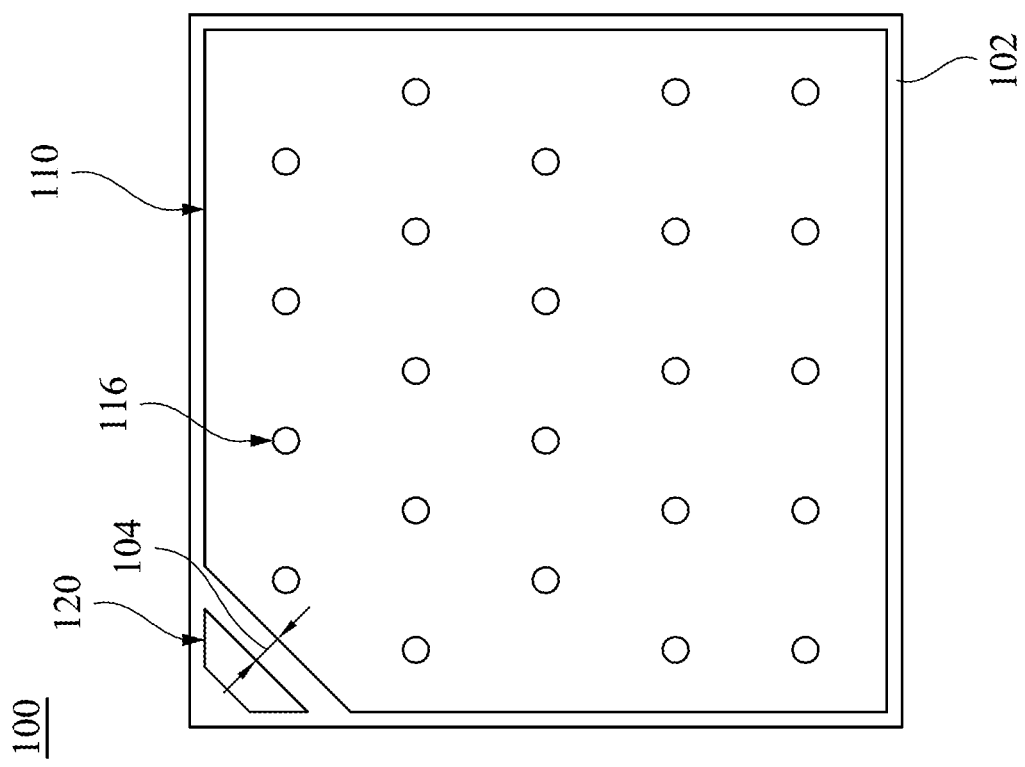
FIG. 1B is a schematic top view of the LED chip of FIG. 1A before forming an electrical-connection layer, a first electrical-connection pad, and a second electrical-connection pad.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It will be understood that, although the terms first, second, third etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present disclosure.

Figure 1A:
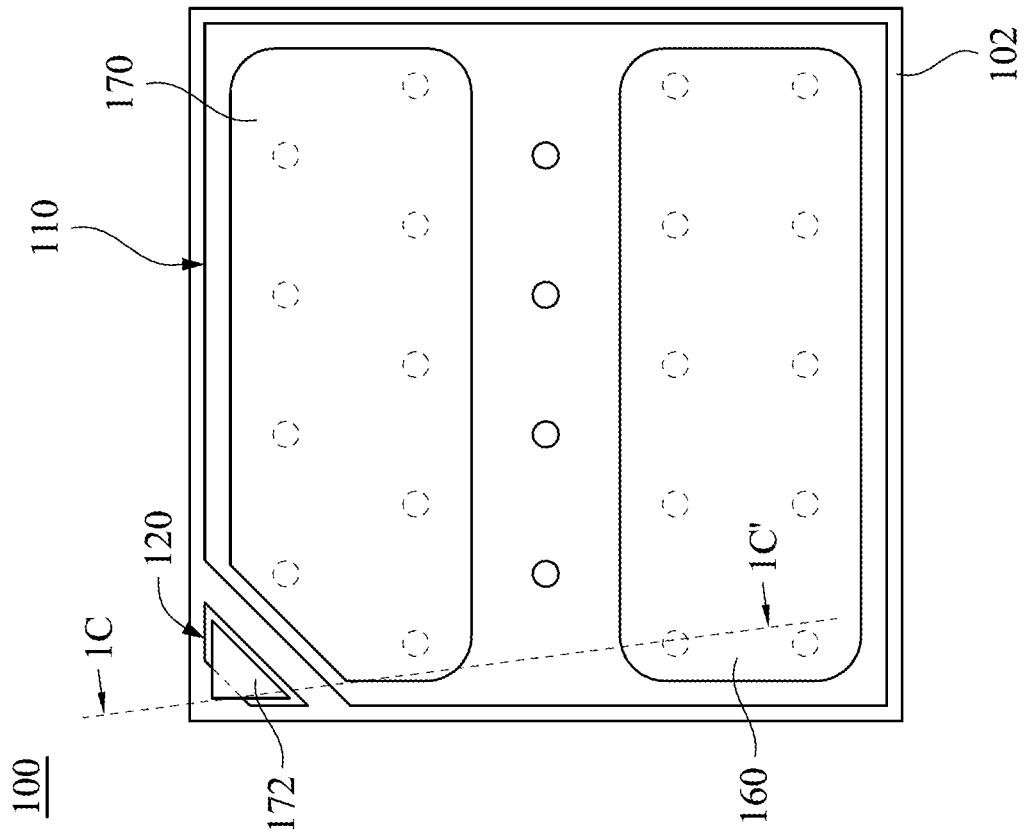
FIG. 1A is a schematic top view of a light-emitting-diode (LED) chip according to a first embodiment of the present disclosure.
Figure 1C:
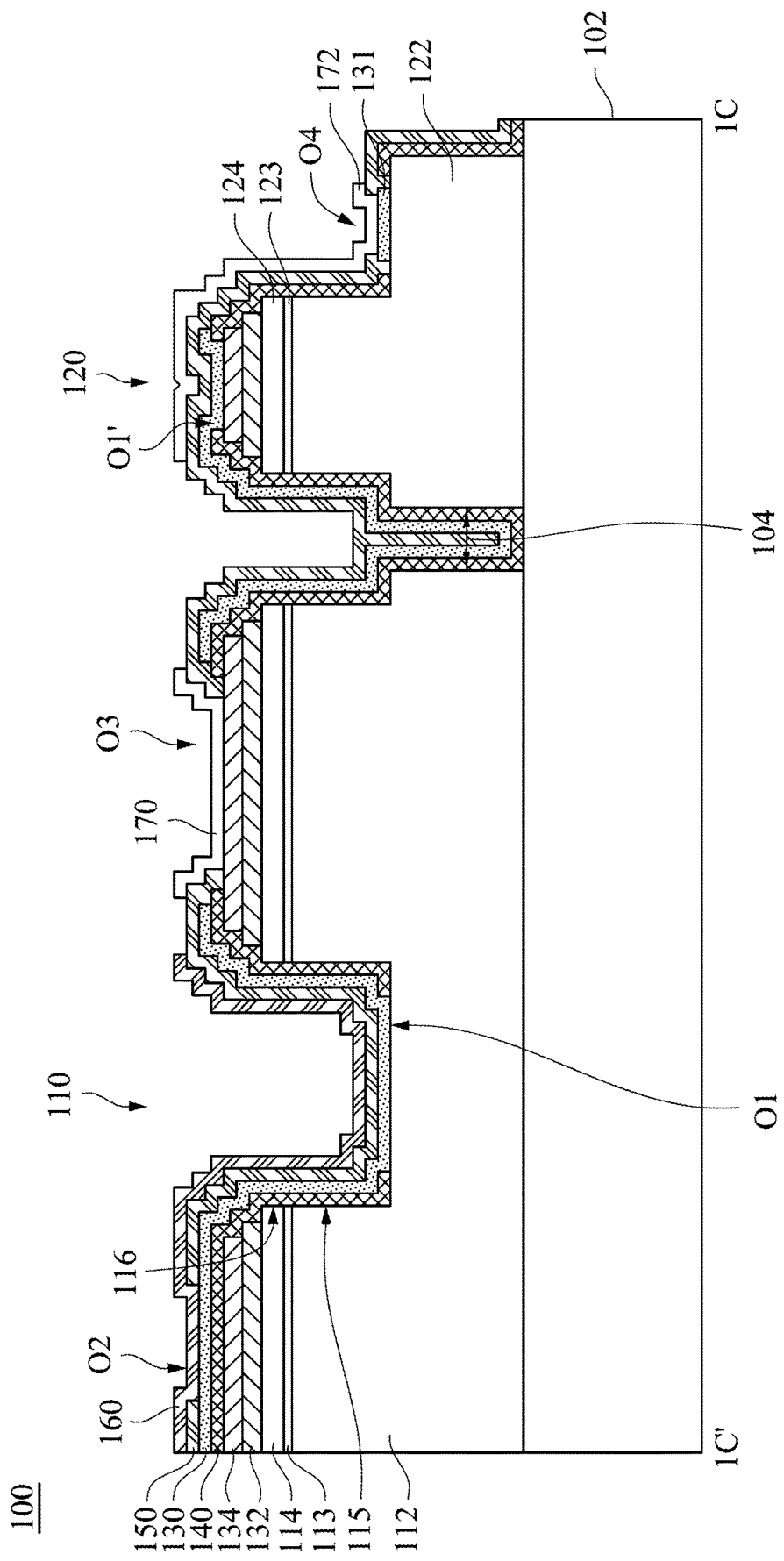
FIG. 1C is a cross-sectional view taken along a line 1C-1C' of FIG. 1A.

Reference is made to FIGS. 1A, 1B, and 1C. FIG. 1A is a schematic top view of a light-emitting-diode (LED) chip 100 according to a first embodiment of the present disclosure. FIG. 1B is a schematic top view of the LED chip 100 of FIG. 1A before forming an electrical-connection layer 160, a first electrical-connection pad 170, and a second electrical-connection pad 172. FIG. 1C is a cross-sectional view taken along a line 1C-1C' of FIG. 1A. In addition, the LED chip 100 of the present disclosure that is illustrated in FIGS. 1A-1C is formed prior to a packaging process.

The LED chip 100 includes a substrate 102, a light-emitting component 110, an electrical static discharge (ESD) protection component 120, a conductive layer 130, a conductor layer 131, an optic-reflection layer 132, a barrier layer 134, a first insulator layer 140, a second insulator layer 150, an electrical-connection layer 160, a first electrical-connection pad 170, and a second electrical-connection pad 172, in which the light-emitting component 110 and the ESD protection component 120 are disposed on the substrate 102. The positions of the light-emitting component 110 and the ESD protection component 120 disposed on the substrate 102 are shown as FIG. 1B. The light-emitting component 110 is adjacent to the ESD protection component 120, in which the light-emitting component 110 and the ESD protection component 120 are separated from each other by a gap 104 existing therebetween.

The light-emitting component 110 includes a first semiconductor layer 112, a first quantum well layer 113, and a second semiconductor layer 114. The first semiconductor layer 112 is disposed on the substrate 102, the first quantum well layer 113 is disposed on the first semiconductor layer 112, and the second semiconductor layer 114 is disposed on the first quantum well layer 113. That is, at least one portion of the first semiconductor layer 112 is disposed between the substrate 102 and the second semiconductor layer 114, and the first quantum well layer 113 is disposed between the first semiconductor layer 112 and the second semiconductor layer 114.

The first semiconductor layer 112 and the second semiconductor layer 114 may have a first type dopant and a second type dopant respectively. For example, the first semiconductor layer 112 may be an N-type GaN layer, and the second semiconductor layer 114 may be a P-type GaN layer. The light-emitting component 110 may be a light-emitting diode component formed from the first semiconductor layer 112, the first quantum well layer 113, and the second semiconductor layer 114, in which the first quantum well layer 113 may serve as a light-emitting layer.

The optic-reflection layer 132 and the barrier layer 134 may be disposed at a side of the second semiconductor layer 114, in which the side of the second semiconductor layer 114 faces away from the substrate 102. The optic-reflection layer 132 is connected to the second semiconductor layer 114, and the optic-reflection layer 132 is disposed between the second semiconductor layer 114 and the barrier layer 134. The optic-reflection layer 132 may be configured to reflect a light beam emitted from the light-emitting component 110, thereby enabling the light beam to travel toward the substrate after reflection. The barrier layer 134 may be configured to prevent migration phenomena from occurring in the optic-reflection layer 132, thereby improving the light-emitting efficiency of the light-emitting component 110. Furthermore, the optic-reflection layer 132 and the barrier layer 134 may be formed from an electric-conduction material. On the other hand, the first semiconductor layer 112 may have at least one groove 115, and the second semiconductor layer 114 may have at least one hole 116 communicating with the groove 115.

The ESD protection component 120 includes a third semiconductor layer 122, a second quantum well layer 123, and a fourth semiconductor layer 124. The third semiconductor layer 122 is disposed on the substrate 102, the second quantum well layer 123 is disposed on the third semiconductor layer 122, and the fourth semiconductor layer 124 is disposed on the second quantum well layer 123. That is, at least one portion of the third semiconductor layer 122 is disposed between the substrate 102 and the fourth semiconductor layer 124, and the second quantum well layer 123 is disposed between the third semiconductor layer 122 and the fourth semiconductor layer 124.

The third semiconductor layer 122 and the fourth semiconductor layer 124 may have the first type dopant and the second type dopant respectively as well. For example, the third semiconductor layer 122 may be an N-type GaN layer, and the fourth semiconductor layer 124 may be a P-type GaN layer. The ESD protection component 120 may be a zener diode component formed from the third semiconductor layer 122, the second quantum well layer 123, and the fourth semiconductor layer 124. In addition, since the optic-reflection layer 132 and the barrier layer 134 are formed after the formation of the light-emitting component 110 and the ESD protection component 120, the optic-reflection layer 132 and the barrier layer 134 may be disposed at a side of the fourth semiconductor layer 124, in which the side of the fourth semiconductor layer 124 faces away from the substrate, as shown in FIG. 1C. However, the positions of the optic-reflection layer 132 and the barrier layer 134 are not limited thereto. In other embodiments, the optic-reflection layer 132 and the barrier layer 134 may be disposed on the light-emitting component 110 only.

The first insulator layer 140 partially covers the light-emitting component 110 and the ESD protection component 120. A portion of the first insulator layer 140 is disposed between the light-emitting component 110 and the ESD protection component 120, such that the light-emitting component 110 and the ESD protection component 120 are separated from each other. The first insulator layer 140 has first openings O1 and O1'. A vertical projection of the first opening O1 on the substrate 102 is located within a vertical projection of the light-emitting component 110 on the substrate 102, and a vertical projection of the first opening O1' on the substrate 102 is located within a vertical projection of the ESD protection component 120 on the substrate 102.

The first insulator layer 140 is covered with the conductive layer 130, and the light-emitting component 110 and the ESD protection component 120 are disposed between the substrate 102 and the conductive layer 130. The conductive layer 130 may be electrically connected to the first semiconductor layer 112 through the hole 116 and the first opening O1 of the first insulator layer 140. The conductive layer 130 may be electrically connected to the optic-reflection layer 132 and the barrier layer 134 disposed on the ESD protection component 120 through the first opening O1' of the first insulator layer 140, thereby electrically connecting to the fourth semiconductor layer 124. In addition, the conductive layer 130 may be separated from the second semiconductor layer 114 and the third semiconductor layer 122 by the first insulator layer 140. With this configuration, the first semiconductor layer 112 and the fourth semiconductor layer 124 may be electrically connected to each other through the conductive layer 130. That is, once an electrical potential is applied to the conductive layer 130, the first semiconductor layer 112 and the fourth semiconductor layer 124 may have substantially the same electrical potential. On the other hand, since the conductive layer 130 is separated from the second semiconductor layer 114 and the third semiconductor layer 122 by the first insulator layer 140, the second semiconductor layer 114 and the third semiconductor layer 122 are electrically isolated from each other. In addition, the conductor layer 131 is connected to the third semiconductor layer 122. The conductive layer 130 and the conductor layer 131 are formed by the same layer, in which the conductive layer 130 and the conductor layer 131 are electrically isolated from each other by dividing the layer into the conductive layer 130 and conductor layer 131 that are separated from each other.

The second insulator layer 150 covers the conductive layer 130 and the first insulator layer 140. The second insulator layer 150 has a second opening O2, a third opening O3, and a fourth opening O4. The electrical-connection layer 160 is electrically connected to the conductive layer 130 through the second opening O2. The first electrical-connection pad 170 is electrically connected to the second semiconductor layer 114 through the third opening O3. The second electrical-connection pad 172 is electrically connected to the third semiconductor layer 122 through the fourth opening O4 and the conductor layer 131.

With the above configuration, after the light-emitting component 110 and the ESD protection component 120 are formed, the light-emitting component 110 can be tested individually, thereby preventing the test result from being affected by the ESD protection component 120. In the test operation, an external testing device (not illustrated) may be electrically connected to the electrical-connection layer 160 and the first electrical-connection pad 170, so as to bias the light-emitting component 110 and test the electrical performance of the light-emitting component 110. For example, a current through the light-emitting component 110 is tested. In this regard, since the second semiconductor layer 114 and the third semiconductor layer 122 are electrically isolated from each other, inaccuracy with regard to the test result caused by the ESD protection component 120 is prevented. For example, the current passing through the light-emitting component 110 is prevented from being affected by the resistance of the ESD protection component 120.

Then, after the light-emitting component 110 is tested and ensured to be operable, a packaging process is performed on the LED chip 100, in which the packaging process includes electrically connecting the first electrical-connection pad 170 and the second electrical-connection pad 172. For example, a conductive film (not illustrated) may be attached to the first electrical-connection pad 170 and the second electrical-connection pad 172. After the packaging process, with the electrical connection between the first semiconductor layer 112 and the fourth semiconductor layer 124, and the electrical connection between the second semiconductor layer 114 and the third semiconductor layer 122, the light-emitting component 110 and the ESD protection component 120 are connected in a reverse parallel connection, such that the ESD protection component 120 can provide ESD protection on the LED chip 100.

Furthermore, processes for manufacturing the first semiconductor layer 112, the first quantum well layer 113, the second semiconductor layer 114 of the light-emitting component 110 and processes for manufacturing the third semiconductor layer 122, the second quantum well layer 123, the fourth semiconductor layer 124 of the ESD protection component 120 may be simultaneously performed. The first semiconductor layer 112 and the third semiconductor layer 122 are formed from the same material, and the second semiconductor layer 114 and the fourth semiconductor layer 124 are formed from the same material. In addition, characteristics of the semiconductor layers and the quantum well layers of the light-emitting component 110 and the ESD protection component 120 are the same. For example, thickness of the first quantum well layer 113 may be the same as that of the second quantum well layer 123. On the other hand, the substrate 102 may be a growth substrate, such as a substrate made of sapphire, and thus the first semiconductor layer 112 and the third semiconductor layer 122 can be grown from the same substrate. In other words, the light-emitting component 110 and the ESD protection component 120 of the LED chip 100 are formed simultaneously, thereby simplifying the process for manufacturing the LED chip 100.

Figure 2B:
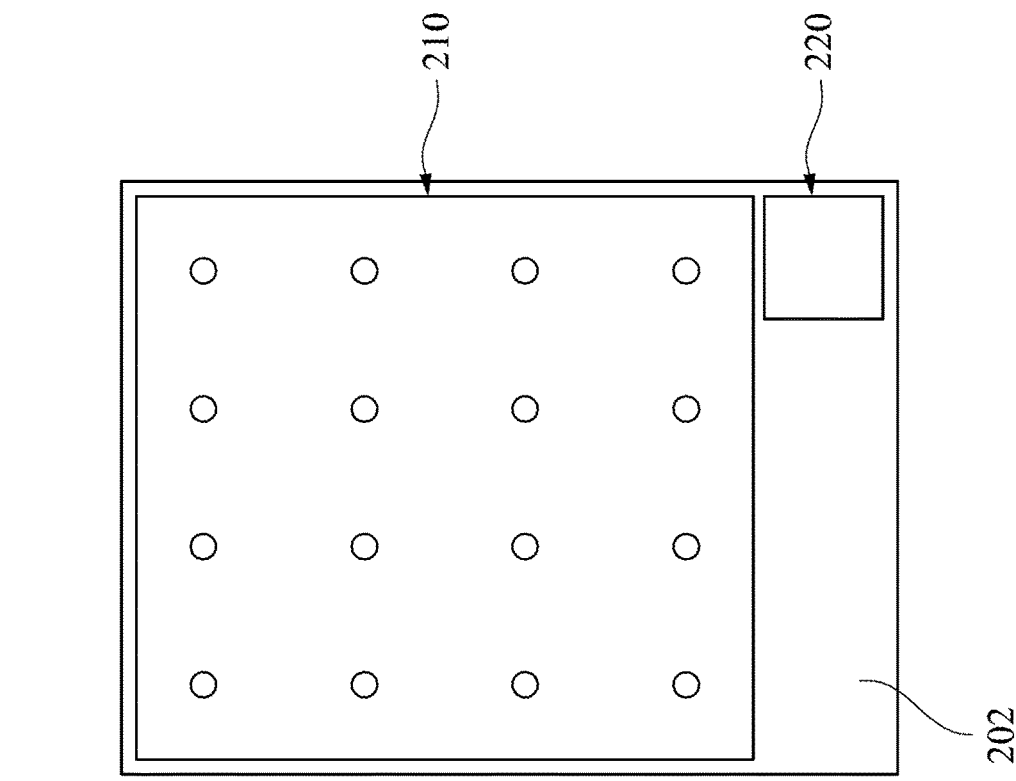
FIG. 2B is a schematic top view of the LED chip of FIG. 2A before forming a first electrical-connection pad and a second electrical-connection pad.
Figure 2A:
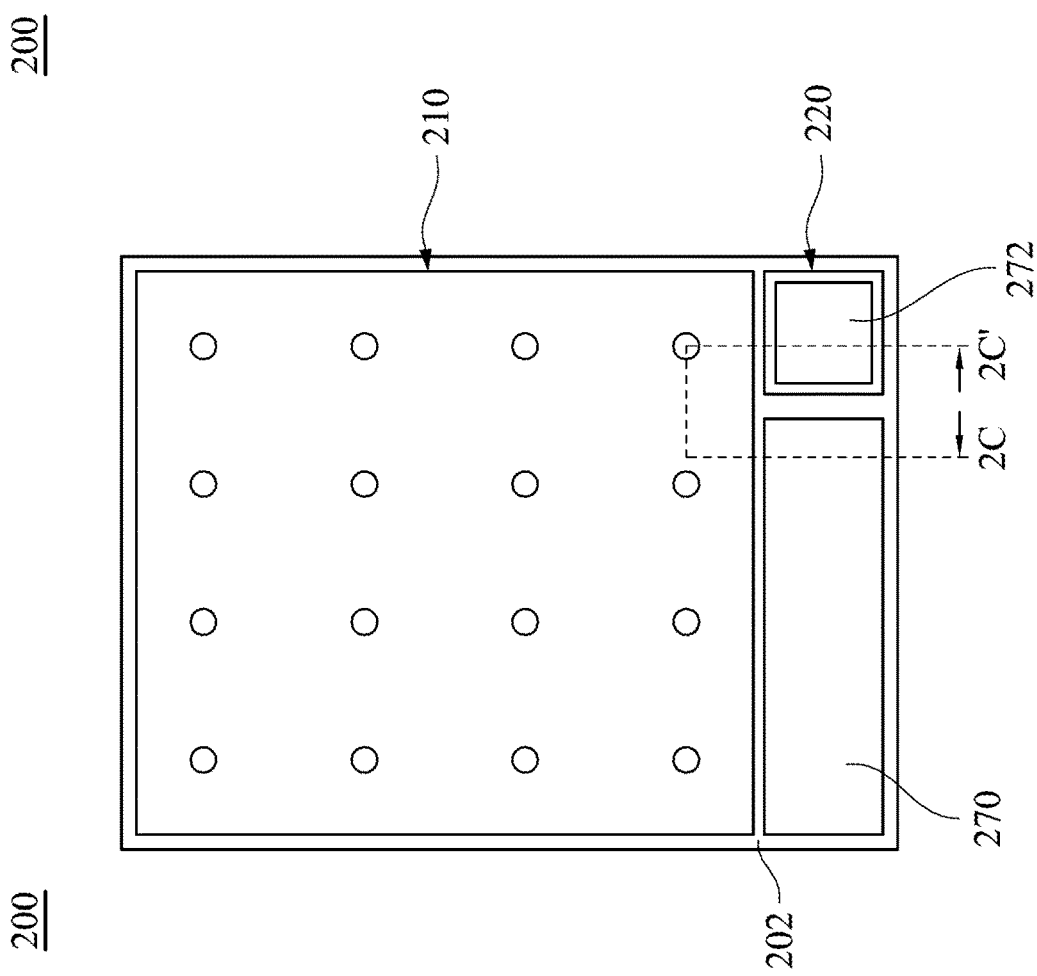
FIG. 2A is a schematic top view of a LED chip according to a second embodiment of the present disclosure.
Figure 2C:
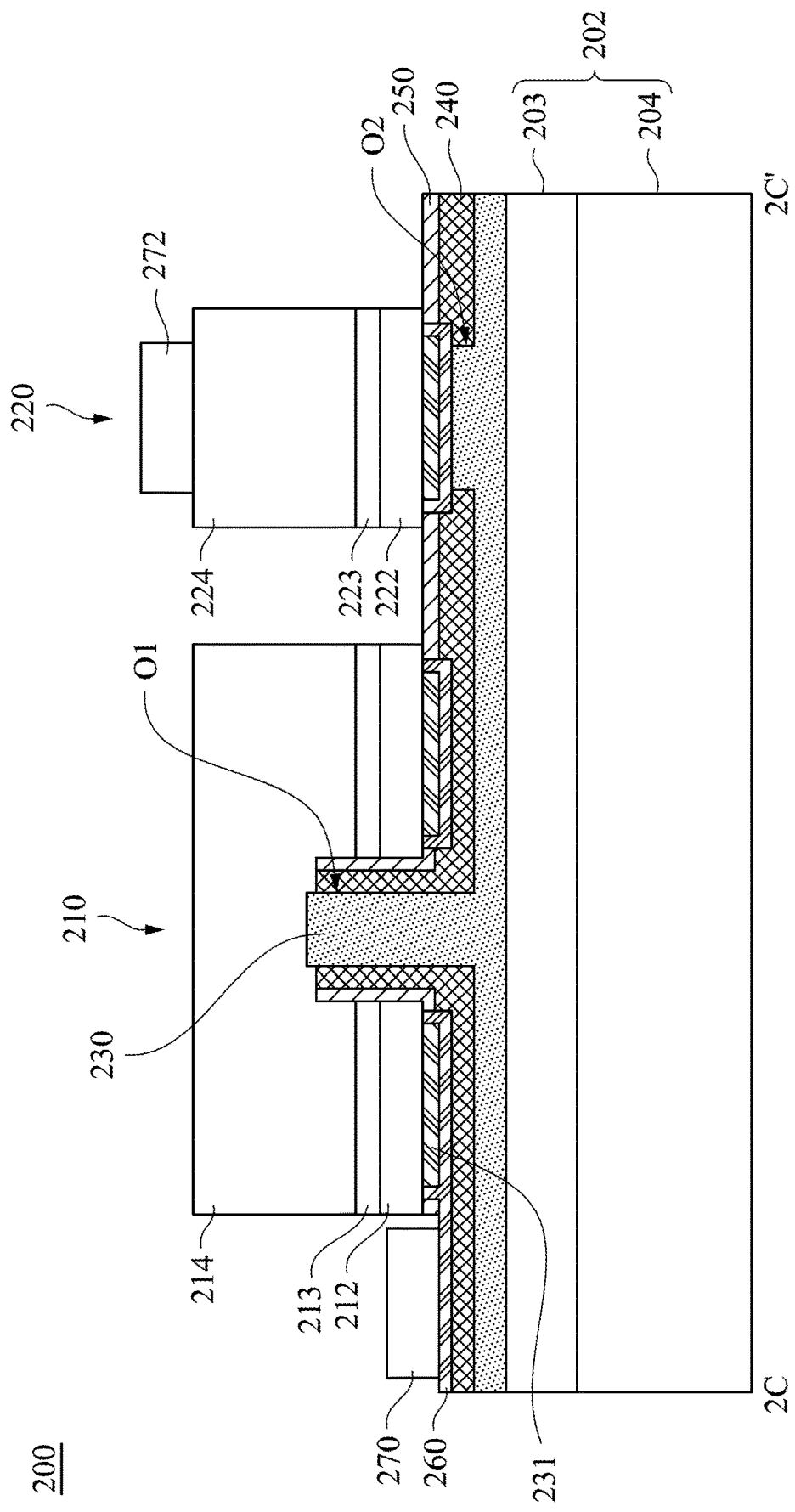
FIG. 2C is a cross-sectional view taken along a line 2C-2C' of FIG. 2A.

Reference is made to FIGS. 2A, 2B, and 2C. FIG. 2A is a schematic top view of a LED chip 200 according to a second embodiment of the present disclosure. FIG. 2B is a schematic top view of the LED chip 200 of FIG. 2A before forming a first electrical-connection pad 270 and a second electrical-connection pad 272. FIG. 2C is a cross-section view taken along a line 2C-2C' of FIG. 2A. In addition, the LED chip 200 of the present disclosure that is illustrated in FIGS. 2A-2C is formed prior to a packaging process.

The LED chip 200 includes a substrate 202, a light-emitting component 210, an ESD protection component 220, a conductive layer 230, a conductor layer 231, a first insulator layer 240, a second insulator layer 250, an electrical-connection layer 260, a first electrical-connection pad 270, and a second electrical-connection pad 272. The light-emitting component 210 and the ESD protection component 220 are disposed on the substrate 202, and the light-emitting component 210 and the ESD protection component 220 are separated from each other.

The substrate 202 includes a bonding layer 203 and a carrying substrate 204. The bonding layer 203 is disposed on the substrate 202, in which the bonding layer 203 may be a metal bonding layer. The conductive layer 230 is disposed on the bonding layer 203, and the conductive layer 230 is jointed with the substrate through the bonding layer 203. The conductive layer 230 is disposed on the conductive layer 230 and has a first opening O1 and a second opening O2. The electrical-connection layer 260 is disposed on the first insulator layer 240, in which the conductive layer 230 is separated from the electrical-connection layer 260 by the first insulator layer 240, such that the conductive layer 230 and the electrical-connection layer 260 are electrically isolated from each other. The second insulator layer 250 is disposed on the first insulator layer 240 and the electrical-connection layer 260, in which the second insulator layer 250 may be a planar layer, so as to perform subsequent processes.

The light-emitting component 210 is disposed on the first insulator layer 240 and the second insulator layer 250, and a vertical projection of the first opening O1 on the substrate is located within a vertical projection of the light-emitting component 210 on the substrate 202. The light-emitting component 210 includes a first semiconductor layer 212, a first quantum well layer 213, and a second semiconductor layer 214. The first semiconductor layer 212 is disposed on the first insulator layer 240 and the second insulator layer 250, the first quantum well layer 213 is disposed on the first semiconductor layer 212, and the second semiconductor layer 214 is disposed on first quantum well layer 213. That is, the first semiconductor layer 212 is disposed between the first insulator layer 240 and the second semiconductor layer 214, and the first quantum well layer 213 is disposed between the first semiconductor layer 212 and the second semiconductor layer 214. The conductive layer 230 may pass through the first semiconductor layer 212 and the first quantum well layer 213 via the first opening O1 of the first insulator layer 240, so as to be extended and electrically connected to the second semiconductor layer 214. Furthermore, the first semiconductor layer 212 is isolated from the conductive layer 230 by the first insulator layer 240 and the second insulator layer 250.

The first semiconductor layer 212 and the second semiconductor layer 214 may have a first type dopant and a second type dopant respectively. For example, the first semiconductor layer 212 may be a P-type GaN layer, and the second semiconductor layer 214 may be a N-type GaN layer. Furthermore, a vertical projection of the light-emitting component 210 on the substrate 202 may be rectangular, as shown in FIGS. 2A and 2B, thereby simplifying the lithographic process for manufacturing the light-emitting component 210. The light-emitting component 210 may be a light-emitting diode component formed from the first semiconductor layer 212, the first quantum well layer 213, and the second semiconductor layer 214, in which the first quantum well layer 213 may serve as a light-emitting layer. In addition, the conductor layer 231 is disposed between the first semiconductor layer 212 and the electrical-connection layer 260. The conductor layer 231 may serve as an ohmic contact layer, so as to reduce resistance between the first semiconductor layer 212 and the electrical-connection layer 260.

The ESD protection component 220 is disposed on the conductive layer 230, the first insulator layer 240, and the second insulator layer 250, and a vertical projection of the opening O2 on the substrate 202 is located within a vertical projection of the ESD protection component 220 on the substrate 202. The ESD protection component 220 includes a third semiconductor layer 222, a second quantum well layer 223, and a fourth semiconductor layer 224. The third semiconductor layer 222 is disposed on the conductive layer 230, the first insulator layer 240, and the second insulator layer 250, the second quantum well layer 223 is disposed on the third semiconductor layer 222, and the fourth semiconductor layer 224 is disposed on the second quantum well layer 223. That is, the third semiconductor layer 222 is disposed between the conductive layer 230 and the fourth semiconductor layer 224, and the second quantum well layer 223 is disposed between the third semiconductor layer 222 and the fourth semiconductor layer 224. The conductive layer 230 may be electrically connected to the third semiconductor layer 222 through the second opening O2 of the first insulator layer 240 and the electrical-connection layer 260. With this configuration, the second semiconductor layer 214 and the third semiconductor layer 222 may be electrically connected to each other through the conductive layer 230. That is, once an electrical potential is applied to the conductive layer 230, the second semiconductor layer 214 and the third semiconductor layer 222 may have substantially the same electrical potential. On the other hand, the first semiconductor layer 212 and the fourth semiconductor layer 224 are electrically isolated from each other.

The third semiconductor layer 222 and the fourth semiconductor layer 224 may have the first type dopant and the second type dopant respectively as well. For example, the third semiconductor layer 222 may be a P-type GaN layer, and the fourth semiconductor layer 224 may be an N-type GaN layer. The ESD protection component 220 may be a zener diode component formed by the third semiconductor layer 222, the second quantum well layer 223, and the fourth semiconductor layer 224. In addition, the conductor layer 231 may be disposed between the third semiconductor layer 222 and the electrical-connection layer 260 as well, so as to serve as an ohmic contact layer therebetween.

The first electrical-connection pad 270 is disposed on the electrical-connection layer 260 and electrically connected to the first semiconductor layer 212 through the electrical-connection layer 260. The second electrical-connection pad 272 is disposed on the fourth semiconductor layer 224 and electrically connected to the fourth semiconductor layer 224.

With the aforementioned configuration, similarly to the first embodiment, after the light-emitting component 210 and the ESD protection component 220 are formed, the light-emitting component 210 can be tested individually, thereby preventing the test result from being affected by the ESD protection component 220. In addition, in the present embodiment, the packaging process for the LED chip 200 includes electrically connecting the first electrical-connection pad 270 and the electrical-connection layer 260 through wire bonding. After the packaging process, with the electrical connection between the first semiconductor layer 212 and the fourth semiconductor layer 224, and the electrical connection between the second semiconductor layer 214 and the third semiconductor layer 222, the light-emitting component 210 and the ESD protection component 220 are connected in a reverse parallel connection, such that the ESD protection component 220 can provide ESD protection on the LED chip 200.

Similarly to the first embodiment, the light-emitting component 210 and the ESD protection component 220 of the LED chip 200 may be formed simultaneously. On the other hand, the semiconductor layers and the quantum well layers of the light-emitting component 210 and the ESD protection component 220 may be grown from a growth substrate (not illustrated). Then, after the semiconductor layers and the quantum well layers of the light-emitting component 210 and the ESD protection component 220 are formed, the resulted structure is transferred to the substrate 202.

In sum, the LED chip of the present disclosure includes the light-emitting component and the ESD protection component, in which the light-emitting component and the ESD protection component may be formed simultaneously, thereby simplifying the process for manufacturing the LED chip. Before the packaging process with the LED chip is formed, since the light-emitting component together with the ESD protection component have not being formed a circuit, the light-emitting component can be tested individually, thereby preventing the test result from being affected by the ESD protection component. After the packaging process with the LED chip is performed, the light-emitting component and the ESD protection component may be connected together in a reverse parallel connection, such that the ESD protection component can provide ESD protection on the LED chip.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of present disclosure provided they fall within the scope of the following claims.

What is claimed is:

1. A light-emitting-diode (LED) chip, comprising:
a substrate;
a conductive layer disposed on the substrate;
a first insulator layer disposed on the conductive layer and having a first opening and a second opening;
an electrical-connection layer disposed on the first insulator layer;
a second insulator layer disposed on the first insulator layer;
a light-emitting component disposed on the first insulator layer and comprising a first semiconductor layer, a first quantum well layer, and a second semiconductor layer, wherein the first semiconductor layer is disposed between the first insulator layer and the second semiconductor layer, and the first quantum well layer is disposed between the first semiconductor layer and the second semiconductor layer, wherein the conductive layer passes through the first semiconductor layer and the first quantum well layer via the first opening of the first insulator layer, so as to be extended and electrically connected to the second semiconductor layer, and the first semiconductor layer is isolated from the conductive layer by the first insulator layer, wherein a vertical projection of the light-emitting component on the substrate viewed in a direction normal to a top surface of the substrate is rectangular; and
an electrical static discharge (ESD) protection component disposed on the first insulator layer and separated from the light-emitting component by a gap, wherein the ESD protection component comprises a third semiconductor layer, a second quantum well layer, and a fourth semiconductor layer, wherein the third semiconductor layer is disposed between the conductive layer and the fourth semiconductor layer, and the second quantum well layer is disposed between the third semiconductor layer and the fourth semiconductor layer,
wherein the electrical-connection layer has an opening aligned with the gap, and the first insulator layer and the second insulator layer extend into the opening of the electrical-connection layer;
wherein the conductive layer is electrically connected to the third semiconductor layer through the second opening of the first insulator layer, wherein each of the first semiconductor layer and the third semiconductor layer has a first type dopant, each of the second semiconductor layer and the fourth semiconductor layer has a second type dopant, and the first semiconductor layer and the fourth semiconductor layer are electrically isolated from each other before packaging the LED chip.

2. The LED chip of claim 1, further comprising:
a first electrical-connection pad disposed on the electrical-connection layer and electrically connected to the first semiconductor layer through the electrical-connection layer; and
a second electrical-connection pad disposed on the fourth semiconductor layer and electrically connected to the fourth semiconductor layer;
wherein the electrical connection layer is electrically connected to the first semiconductor layer.

3. The LED chip of claim 1, wherein the first semiconductor layer and the third semiconductor layer are formed from the same material, and the second semiconductor layer and the fourth semiconductor layer are formed from the same material.

4. A light-emitting-diode (LED) chip, comprising:
a substrate;
a conductive layer disposed on the substrate;
a first insulator layer disposed on the conductive layer and having a first opening and a second opening;
an electrical-connection layer disposed on the first insulator layer;
a light-emitting component disposed on the first insulator layer and comprising a first semiconductor layer, a first quantum well layer, and a second semiconductor layer, wherein the first semiconductor layer is disposed between the first insulator layer and the second semiconductor layer, and the first quantum well layer is disposed between the first semiconductor layer and the second semiconductor layer, wherein the conductive layer passes through the first semiconductor layer and the first quantum well layer via the first opening of the first insulator layer, so as to be extended and electrically connected to the second semiconductor layer, and the first semiconductor layer is isolated from the conductive layer by the first insulator layer, the electrical-connection layer is electrically connected to the first semiconductor layer, wherein a vertical projection of the light-emitting component on the substrate viewed in a direction normal to a top surface of the substrate is rectangular; and
an electrical static discharge (ESD) protection component disposed on the first insulator layer and separated from the light-emitting component, wherein the ESD protection component comprises a third semiconductor layer, a second quantum well layer, and a fourth semiconductor layer, wherein the third semiconductor layer is disposed between the conductive layer and the fourth semiconductor layer, and the second quantum well layer is disposed between the third semiconductor layer and the fourth semiconductor layer,
wherein the conductive layer is electrically connected to the third semiconductor layer via the electrical-connection layer and the conductive layer goes through the second opening of the first insulator layer to connect to the electrical connection layer,
wherein each of the first semiconductor layer and the third semiconductor layer has a first type dopant, each of the second semiconductor layer and the fourth semiconductor layer has a second type dopant, and the first semiconductor layer and the fourth semiconductor layer are electrically isolated from each other before packaging the LED chip.

5. The LED chip of claim 4, further comprising:
a first electrical-connection pad disposed on the electrical-connection layer and electrically connected to the first semiconductor layer through the electrical-connection layer; and
a second electrical-connection pad disposed on the fourth semiconductor layer and electrically connected to the fourth semiconductor layer.

6. The LED chip of claim 4, wherein the first semiconductor layer and the third semiconductor layer are formed from the same material, and the second semiconductor layer and the fourth semiconductor layer are formed from the same material.

7. A light-emitting-diode (LED) chip, comprising:
a substrate;
a conductive layer disposed on the substrate;
a first insulator layer disposed on the conductive layer and having a first opening and a second opening;
a second insulator layer disposed on the first insulator layer;
a light-emitting component disposed on the first insulator layer and comprising a first semiconductor layer, a first quantum well layer, and a second semiconductor layer, wherein the first semiconductor layer is disposed between the first insulator layer and the second semiconductor layer, and the first quantum well layer is disposed between the first semiconductor layer and the second semiconductor layer, wherein the conductive layer passes through the first semiconductor layer and the first quantum well layer via the first opening of the first insulator layer, so as to be extended and electrically connected to the second semiconductor layer, and the first semiconductor layer is isolated from the conductive layer by the first insulator layer and the second insulator layer, wherein a vertical projection of the light-emitting component on the substrate viewed in a direction normal to a top surface of the substrate is rectangular; and
an electrical static discharge (ESD) protection component disposed on the first insulator layer and separated from the light-emitting component, wherein the ESD protection component comprises a third semiconductor layer, a second quantum well layer, and a fourth semiconductor layer, wherein the third semiconductor layer is disposed between the conductive layer and the fourth semiconductor layer, and the second quantum well layer is disposed between the third semiconductor layer and the fourth semiconductor layer, wherein the conductive layer is electrically connected to the third semiconductor layer through the second opening of the first insulator layer,
wherein each of the first semiconductor layer and the third semiconductor layer has a first type dopant, each of the second semiconductor layer and the fourth semiconductor layer has a second type dopant, and the first semiconductor layer and the fourth semiconductor layer are electrically isolated from each other before packaging the LED chip.

8. The LED chip of claim 7, further comprising:
an electrical-connection layer disposed on the first insulator layer and electrically connected to the first semiconductor layer;
a first electrical-connection pad disposed on the electrical-connection layer and electrically connected to the first semiconductor layer through the electrical-connection layer; and
a second electrical-connection pad disposed on the fourth semiconductor layer and electrically connected to the fourth semiconductor layer.

9. The LED chip of claim 7, wherein the first semiconductor layer and the third semiconductor layer are formed from the same material, and the second semiconductor layer and the fourth semiconductor layer are formed from the same material.

* * * * *